April 7, 1970 SEIJI KUBO 3,504,430

METHOD OF MAKING SEMICONDUCTOR DEVICES HAVING INSULATING FILMS

Filed June 13, 1967 2 Sheets-Sheet 1

INVENTOR

SEIJI KUBO

BY Paul M. Craig, Jr.

ATTORNEY

INVENTOR

SEIJI KUBO

BY Paul M. Craig, Jr.

ATTORNEY 3,504,430
METHOD OF MAKING SEMICONDUCTOR DEVICES HAVING INSULATING FILMS

Seiji Kubo, Kokubunji-shi, Japan, assignor to Hitachi, Ltd., Tokyo, Japan, a corporation of Japan Filed June 13, 1967, Ser. No. 645,718
Claims priority, application Japan, June 27, 1966, 41/373
Int. Cl. B01j *17/00;* H01l *11/14*
U.S. Cl. 29—571 12 Claims

ABSTRACT OF THE DISCLOSURE

A method of making a semiconductor device, such as an insulated control electrode type field effect transistor, in which electrodes are formed in holes provided in insulating films on a source region and a drain region by the photoetching technique in quite a short time because the thickness of said films is made smaller than that of the insulating films upon which a control electrode is formed. According to this method, it is possible to reduce pinhole accidents as well as to provide thick passivation films at desired positions.

Figure 1A:
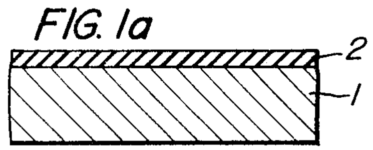

This invention relates to a semiconductor device having insulating films and more particularly to a semiconductor device having a control electrode on an insulating film.

Recently, as the integration of semiconductor devices has become popular, attention has come to be paid to the metal-insulator-semiconductor structure or the so-called MIS structure. A relatively simple and typical example of the MIS structure is found in a capacitor of MOS (metal oxide semiconductor) structure which consists of a semiconductor substrate, an oxide insulating layer deposited on said substrate and a conductive layer formed on said insulating layer.

The MIS structure is also utilized in an active element such as an insulated gate field effect transistor. This transistor generally consists of a first conductivity type semiconductor substrate, two second conductivity type regions formed separately upon one principal surface of said substrate, an insulating gate layer covering that part of said substrate which is positioned between said second conductivity type regions, a conductive layer deposited on said gate layer and a conductive layer deposited on each of said second conductivity type regions. As is well known, in such a transistor majority carriers passing through a conductive path or a so-called channel placed just under said gate layer are controlled with an electric potential of said gate conductive layer. Another important example of the MIS structure is found in a recently developed integrated circuit. The integrated circuit comprises a bipolar transistor, a resistor and a capacitor in addition to the aforementioned capacitor and transistor. One of the important problems encountered in such an integrated circuit is the interconnection of each element and such interconnection is achieved mostly by use of said MIS structure. For example, two circuit elements formed in a semiconductor substrate are interconnected with an evaporated metal lead adhered to an insulating film (e.g. silicon oxide or silicon nitride) covering the surfaces of said substrate. When the number of the elements is large, a crossover structure, i.e. a structure wherein lead wires for interconnection cross over an insulating film covering other elements, becomes necessary.

When manufacturing such devices, two important problems are encountered which relate to the thickness of insulating film; one of the problems stems from the fact that the electrical properties of an element are related with the thickness of the insulating films, and the other stems from the fact that the pinhole density in the insulating film is related to the thickness of the film. For example, the capacitance of an MOS capacitor is nearly inversely proportional to the thickness of an insulating film placed between a conductive layer and a semiconductor substrate, and the thinner the insulating gate layer becomes, the higher the mutual conductance (gm) of an insulated gate field effect transistor becomes and the lower the threshold voltage thereof becomes. Accordingly, in order to obtain a large capacitance, a high mutual conductance or a low threshold voltage it is often required to provide under a conductive layer an insulating film as thin as possible. Further, for the purpose of increasing the accuracy of the photoetching process, a thin insulating film is desirable. On the other hand, pinholes, which short-circuit a semiconductor substrate or a semiconductor region formed in said substrate and a conducting metal layer on an insulating layer, become more numerous as the insulating layer becomes thinner. Accordingly, in order to reduce the pinhole density it is desirable to make the insulating layer as thick as possible. There can be considered various reasons for the generation of pinholes. One of them is as follows. In order to make a hole reaching the surface of a semiconductor substrate through an insulating film, the photoetching treatment is generally applied. When said treatment is used, an etchant permeates through the imperfections of a corrosion resting mask or through pinholes and undesirably corrodes parts of an insulating film and thus pinholes are produced in these parts. Accordingly, in order to prevent said phenomenon it is necessary to make the insulating film as thick as possible in addition to making a perfect etching mask layer. A thick insulating film is also desirable for reducing the stray capacitance between a distributing conductive layer extending over an insulating layer and a semiconductor substrate.

Compromise between said two conflicting requirements, i.e. making an insulating film as thin as possible and making the film as thick as possible, is not found in the prior arts.

Accordingly, a primary object of this invention is to improve the electrical characteristics of a semiconductor device comprising insulating films.

Another object of the invention is to provide a method to reduce the deficiencies based on the imperfections of an etching mask layer or an etching resistive layer, which are encountered in the process of the etching treatment of insulating films.

A further object of the invention is to provide a relatively simple method of making said semiconductor device having improved electrical characteristics.

One embodiment of the method according to this invention comprises the steps of forming insulating films (e.g. silicon dioxide film) on a semiconductor substrate in a way that the film becomes thinner at least in two parts compared with other parts (thickness of these two parts may be either equal or different, but must be smaller than that of the other parts), providing a hole penetrating through the thinner part (either part when the thickness is the same) of said thin parts to the semiconductor substrate, and forming conductive layers on the thicker part of said two parts (or the other part when the thickness is the same) and in said hole on the semiconductor substrate. According to this method, said conflicting requirements, i.e. making an insulating film under a conductive layer to be used as control electrode thin, making insulating films in the other parts thick and reducing pinhole accidents under the control electrode, are mostly fulfilled. This method has advantages that the time required to make a hole reaching the semiconductor substrate through the insulating film can be reduced (reduction of pinhole accidents) and that the insulating films can be made thick or thin as required.

Other objects, features and advantages of the invention will become more apparent from the following detailed description of the embodiments of the invention when taken in conjunction with the accompanying drawings, in which:

FIGS. 1*a* to 1*f* are cross-sections showing an example of the manufacturing process according to the invention of an MOS field effect transistor for use in a semiconductor integrated circuit;

FIGS. 2*a* to 2*h* are cross-sections showing another example of the manufacturing process according to the invention of an MOS field effect transistor; and FIGS. 3*a* to 3*c* and 4*a* to 4*c* are sectional diagrams showing examples of the manufacturing process according to the invention of a part of a structure comprising an MOS capacitor and a semiconductor resistor in a semiconductor integrated circuit.

Now, some embodiments of the invention will be described with reference to the accompanying drawings.

EXAMPLE 1

Figure 1B:
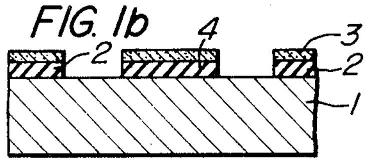
Figure 1C:
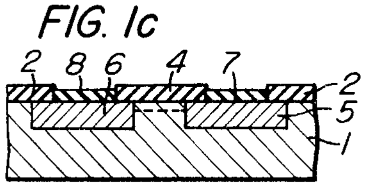
Figure 1D:
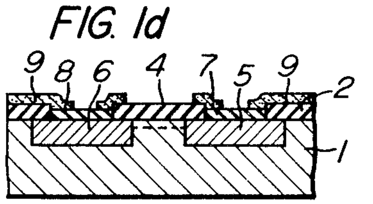
Figure 1E:
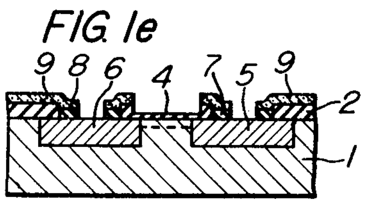
Figure 1F:
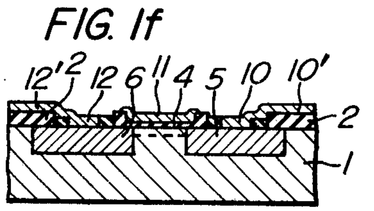

FIGS. 1*a* to 1*f* show the stages of making a P-channel MOS field effect transistor used as an element in a semiconductor integrated circuit. An N-type silicon wafer having a specific resistance of 1–10 Ω-cm. is prepared and its surfaces are made smooth by known chemical etching and mechanical lapping techniques. Then, said wafer is placed in an atmosphere of dry oxygen or water vapor of about 1200° C. to form a silicon oxide film having a thickness of about 7000–10,000 A. This state is shown in FIG. 1*a*, in which reference numeral 1 designates a silicon wafer and 2 designates a silicon oxide film. Then, a photoetching treatment is performed to form holes for selective diffusion of P-type impurities on both sides of an insulating gate layer as shown in FIG. 1*b*. Reference numeral 3 indicates a photoresistive layer. Through said holes boron is diffused as a P-type dopant and, as shown in FIG. 1*c*, a P-type drain region 5 and a P-type source region 6 are formed in the N-type substrate 1 and at the same time said holes are closed with thermally produced silicon oxide films 7 and 8 (thickness thereof is about 6000 A.). In FIG. 1*d*, photoresistive films 9 are adhered for further photoetching treatment. In this case, it is possible to obtain a thin insulating gate layer (about 1500 A.) and holes for connecting a source electrode and a drain electrode at the same time by providing photoresistive layers 9 as shown in FIG. 1*d* and by use of the fact that the oxide layer 4 is thicker than the oxide layers 7 and 8. FIG. 1*e* shows the state of the semiconductor device after said photoetching treatment. In this stage, it is to be noted that the oxide films 2 covered with the photo-resistive layers 9 are thicker than the oxide films 7 and 8. This means that even if imperfections are present in the photoresistive layers 9, pinholes reaching the semiconductor substrate 1 are not generated in the films 2 with etchant permeating through the imperfections of said photo-resistive layers 9 when providing a hole reaching the region 5 or 6 through the film 7 or 8 because the oxide films 7 and 8 are thinner. Finally, all the photoresistive layers 9 are eliminated and electrode metal such as aluminum is deposited on all surfaces by evaporation. Then, the metal, except the part in the drain, gate and source regions, is removed as shown in FIG. 1*f* to obtain a drain electrode 10, a gate electrode 11 and a source electrode 12. These electrodes are coupled to other elements with interconnecting leads 10′ and 12′ extending over the insulating layers 2. Since the distributing layer 10′ or 12′ extends over the thicker insulating layer 2, which includes few pinholes as described hereinabove, the distributing layers and the semiconductor substrate are rarely short-circuited and the stray capacitance present at the distributing layers is small.

EXAMPLE 2

Figure 2A:
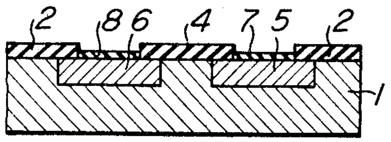
Figure 2B:
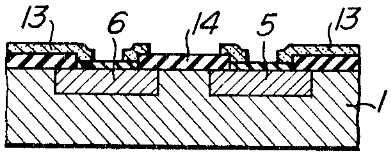
Figure 2C:
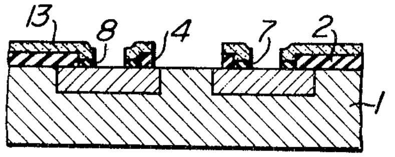
Figure 2D:
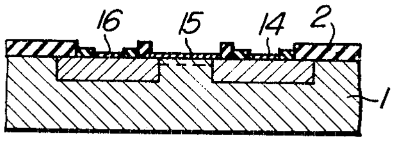
Figure 2E:
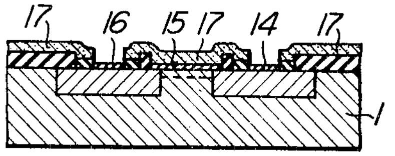
Figure 2F:
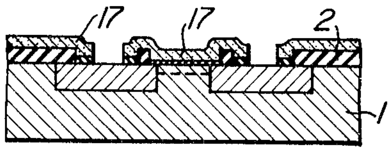
Figure 2G:
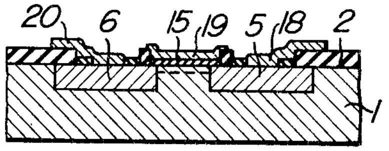
Figure 2H:
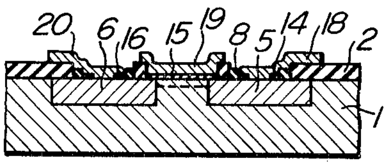

FIGS. 2*a* to 2*h* show another embodiment of the invention. FIG. 2*a* corresponds to FIG. 1*c*. By use of such a wafer, another embodiment of the invention can be realized. As shown in FIG. 2*b* photoresistive films 13 are provided and predetermined parts of the insulating layers 7, 8 and 4 are eliminated down to the semiconductor substrate as shown in FIG. 2*c*. Then, new silicon oxide films 14, 15 and 16 are formed in an atmosphere of high temperature water vapor. Further, all the surfaces of the oxide films except the oxide films 14 and 16 for the connection of a drain electrode and a source electrode are provided with photo-resistive films and holes are provided in the predetermined parts. The regions not covered with the photo-resistive films are not limited to the regions shown in FIG. 2*e*, but the source region 5 and the drain region 6 can be made wider or narrower. In other words, since the holes which form the source electrode and drain electrode are defined by the holes previously provided in the oxide layers 7 and 8, high accuracy is not required when making the holes in the oxide layers 14 and 16. Further, since the oxide layers 14 and 16 are very thin, the time for exposing the body to an etchant can be very short, and accordingly, it is quite rare that the oxide layer 15 or the other oxide layers are corroded with the etchant and that pinholes are produced at the corroded parts. The state of the semiconductor device after the holes are provided is shown in FIG. 2*f*. Finally, metal (e.g. aluminum) electrodes are provided according to a suitable method to obtain a structure as shown in FIG. 2*g*. It is permissible to leave parts of the oxide layers 14 and 16 on the drain and source regions as shown in FIG. 2*h*.

EXAMPLE 3

Figure 3A:
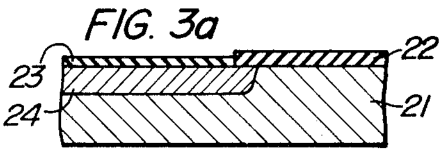
Figure 3B:
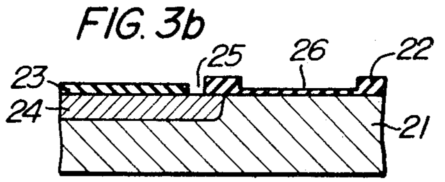
Figure 3C:
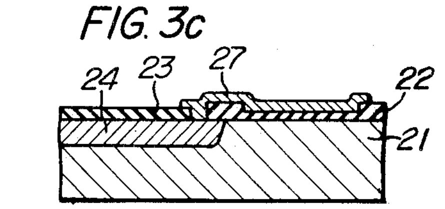

FIGS. 3*a* to 3*c* illustrate a part of a semiconductor integrated circuit which consists of an MOS capacitor and a part of a semiconductor resistor. FIG. 3*a* shows the state of the semiconductor device after a P-type semiconductive resistor region 24 and a relatively thin (about 5000 A.) thermally produced silicon oxide layer 23 are formed by selectively diffusing a P-type impurity (e.g. boron) through windows provided in an N-type semiconductor substrate 21 covered with a thick (about 10,000 A.) silicon oxide film 22. Then, as shown in FIG. 3*b*, a hole 25 for the terminal of the resistor 24 is provided by the photo-etching technique and in order to make the MOS capacitor having a high capacitance in a position adjacent to said hole, the insulating film 22 of the part 26 for forming a control electrode is made thin. Finally, one of the terminals of the resistor 24 is connected to one of the electrodes of the MOS capacitor with an interconnecting lead 27 as shown in FIG. 3*c*. This method is quite suitable for forming an integrated circuit with a field effect transistor shown in FIG. 1.

EXAMPLE 4

Figure 4A:
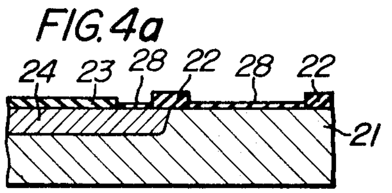
Figure 4B:
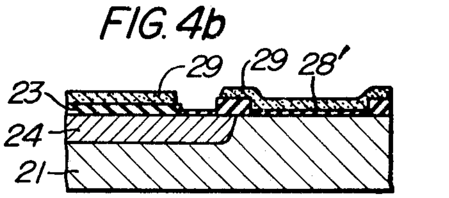
Figure 4C:
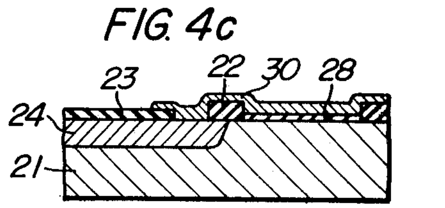

FIGS. 4*a* to 4*c* show the same case with FIGS. 3*a* to 3*c*, but the method of manufacture is different. FIG. 4*a* shows the state of the semiconductor device when a thin (about 1000 A.) and new thermally produced oxide film 28 is formed after holes are made in the structure shown in FIG. 3*a*. Then, a photo-resistive film 29 is provided and a hole for deriving a terminal of a resistor is formed. Then, the resistor terminal, an MOS capacitor terminal and an interconnecting lead are formed at the same time by aluminum evaporation.

Though various embodiments of the invention are described independently hereinabove, it will be evident that a semiconductor integrated circuit can advantageously be made by combining said embodiments, e.g. the embodiments shown in FIGS. 1*a* to 1*f* and FIGS. 3*a* to 3*c* or those in FIGS. 2*a* to 2*h* and FIGS. 4*a* to 4*c*. It is a great advantage of the invention when considered from a practical point of view that positioning of photo-resistive masks as shown partly in FIGS. 4*b* and 4*c* does not require much accuracy. Further, it is postulated in the above description that insulating films are etched with equal speed. However, if it is possible to etch silicon oxide or the like at different speeds with a simple method, then the invention will be further improved. Though thermal formation of silicon oxide films is employed in the above description, the thermal decomposition method or the anodic oxidation method can equally be employed.

Though the invention is described in conjunction with some embodiments of the invention hereinabove, the invention is by no means restricted thereto. It will be evident to those skilled in the art that a semiconductor material and its conductivity type, insulator material (e.g. phosphor glass or boron glass) and its production method or the like can easily be changed without departing from the spirit of the invention.

What is claimed is:

1. A method of making a semiconductor device having an insulating film, comprising the steps of:
- (a) forming on a semiconductor substrate an insulating film having a thick part and a thin part;
- (b) providing an etching resisting mask on the surface of said insulating film except on one portion of said thick part and at least one portion of said thin part;
- (c) making at said portion in said thin part a hole reaching the semiconductor substrate and making said portion of said thick part thin by simultaneously exposing the portions of said insulating film not covered with said mask to an etchant; and
- (d) forming conductive layers at least on a part of said thinned portion and on the semiconductor substrate in said hole.

2. A method according to claim 1, further comprising the step of forming a conductive layer on a part of said thick insulating film formerly covered with said mask.

3. A method of making a semiconductor device having insulating films, comprising the steps of:
- (a) forming a relatively thick insulating film having at least one hole on one principal surface of a semiconductor substrate having a first conductivity type;
- (b) forming a second conductivity type region by selectively diffusing a conductivity type determining impurity through said hole;
- (c) forming a relatively thin insulating film which covers the surface of said second conductivity type region formed in said hole;
- (d) providing a corrosion resisting mask on the parts of the insulating films except at least a part of said thin insulating film and a part of said thick insulating film;
- (e) making a hole reaching the semiconductor substrate through said part of said thin insulating film and making a part of said thick insulating film thinner by simultaneously exposing the parts of said insulating films not covered with said mask to an etchant; and
- (f) forming a first, a second and a third conductivity layers on said thinned part of the thick insulating film, on the semiconductor substrate in the hole and on the thick insulating film formerly covered with said masks, respectively.

4. A method of making a semiconductor device having insulating films, comprising the steps of:
- (a) forming a relatively thick insulating film having at least a pair of holes upon a principal surface of a first conductivity type semiconductor substrate;
- (b) forming a pair of second conductivity type regions by selectively introducing an impurity determining said second conductivity type through said holes into said semiconductor substrate;
- (c) forming a relatively thin insulating film in said holes on said pair of second conductivity type regions;
- (d) providing a corrosion resisting mask on parts of the insulating film except at least one part of the relatively thick insulating film covering the part of the first conductivity type region sandwiched by said pair of second conductivity type regions, said one part of the relatively thick insulating film being positioned between said pair of holes, and except at least one part of said relatively thin insulating film;
- (e) making said at least one part of the relatively thick insulating film not covered with said mask thinner and eliminating at least a part of said relatively thin insulating film by exposing the parts of the insulating films not covered with said mask to an etchant; and
- (f) forming conductive layers on the second conductivity type region from which said relatively thin insulating film is eliminated and on said thinned insulating film.

5. A method of making a semiconductor device having an insulating film, comprising the steps of:
- (a) forming an insulating film including a first and a second thin parts and a thick part on a surface of a semiconductor substrate;
- (b) covering said insulating film except at least a part of said second thin part with a corrosion resisting mask;
- (c) forming in said second thin part of said film at least one hole reaching the semiconductor substrate by exposing the part of said insulating film not covered with said mask to an etchant; and
- (d) forming conductive layers on the semiconductor substrate in said hole and on at least a part of said first thin part of the insulating film.

6. A method according to claim 5, further comprising the step of forming a conductive layer on a part of the thick insulating film.

7. A method of making a semiconductor device having an insulating film, comprising the steps of:
- (a) forming on a semiconductor substrate an insulating film including a first and a second thin parts the thicknesses of which are equal and a third thick part;
- (b) providing a corrosion resisting mask on said insulating film except at least a part of said first thin part;
- (c) forming a hole reaching the semiconductor substrate by exposing the part of the insulating film not covered with said mask to an etchant; and
- (d) forming conductive layers both on at least a part of said second thin part and on the semiconductor substrate in said hole.

8. A method of making a semiconductor device having insulating films, comprising the steps of:
- (a) providing a first, relatively thick, insulating film having at least one hole on one principal surface of a first conductivity type semiconductor substrate;
- (b) forming a second conductivity type region by selectively introducing a conductivity type determining impurity through said hole into said semiconductor substrate;
- (c) forming a second, relatively thin, insulating film in said hole on the surface of said second conductivity type region;
- (d) exposing a first and a second parts of the semiconductor surface by eliminating at least a part of said second insulating film and a part of said first insulating film respectively;
- (e) forming a third and a fourth insulating films thinner than said second insulating film on the first and second parts of the semiconductor surface from which the insulating films are eliminated;
- (f) providing a corrosion resisting mask on the insulating films except at least a part of the third insulating film on said second conductivity type region;

) making a hole reaching said second conductivity type region by exposing the part of the third insulating film not covered with said mask to an etchant; and :) forming conductive layers electrically connecting to the second conductivity type region in said hole and on the fourth insulating film provided after said relatively thick insulating film is eliminated.

A method of making a semiconductor device having insulating films, comprising the steps of:

) providing a relatively thick insulating film having at least a pair of holes in one principal surface of a first conductivity type semiconductor sunbstrate;

) forming a plurality of mutually separated second conductivity type regions by selectively introducing a conductivity type determining impurity through said holes into said semiconductor substrate;

) forming relatively thin insulating films on said second conductivity type regions;

l) exposing the semiconductor surface by eliminating at least a part of said relatively thick insulating film placed between said first pair of holes and at least a part of the relatively thin insulating films in said holes;

:) forming a thinner insulating film on the surface parts of the semiconductor substrate from which the insulating films are eliminated;

) providing a corrosion resisting mask on the surface part of said insulating films except at least a part of said thinner insulating film placed on said second conductivity type regions;

;) making at least one hole reaching said second conductivity type region by exposing the part of the insulating film not covered with said mask to an etchant; and ı) forming conductive layers both on said second conductivity type regions in said at least one hole and on said thinner insulating film disposed on said first conductivity type region.

). A method for producing an insulated gate type effect transistor comprising the steps of:

ırming on a surface of a semiconductor substrate a thick insulating film having a pair of holes extending to the surface of the substrate;

ırming a pair of spaced source and drain regions by introducing a conductivity type determining impurity through said pair of holes into said semiconductor substrate;

ırming thin insulating films in said pair of holes to cover the source and drain regions;

ɔplying a mask layer of corrosion resisting material on the surface of said insulating films except at least a portion of each of said thin insulating films covering said source and drain regions and except a portion of said thick insulating film between said source and drain regions;

ɛposing the combination thus composed to an etchant to form openings extending to the surface of each of said source and drain regions in said thin insulating film and to make said portion of the thick insulating film between said source and drain regions thin;

ɛmoving said mask layer; and

ɔrming source and drain electrodes connected to said source and drain regions through said openings, respectively, and a gate electrode on said thinned insulating film between said source and drain regions.

1. A method for producing an insulated gate type l effect transistor comprising the steps of:

ɔrming on a surface of a semiconductor substrate an insulating film having a pair of holes extending to the surface of the substrate;

forming a pair of spaced source and drain regions by introducing a conductivity type determining impurity through said pair of holes into said semiconductor substrate;

removing at least a part of the insulating film between said source and drain regions to expose the surface of the substrate;

forming thin insulating films of the same thickness to cover said source and drain regions and the exposed surface of the substrate between said source and drain regions;

applying a mask layer of corrosion resisting material on the surfaces of the insulating films except at least a part of each of said thin insulating films covering said source and drain regions;

exposing the combination thus composed to an etchant to form openings extending to the surface of each of said source and drain regions;

removing said mask layer; and forming source and drain electrodes connected to said source and drain regions through said openings, respectively, and a gate electrode on said thin insulating film between said source and drain regions.

12. A method for producing an insulated gate type field effect transistor comprising the steps of:

forming on a surface of a semiconductor substrate an insulating film having a pair of holes extending to the surface of the substrate;

forming a pair of spaced source and drain regions by introducing a conductivity type determining impurity through said pair of holes into said semiconductor substrate in an oxidizing atmosphere, other insulating films of an oxide of the semiconductor being formed in said pair of holes to cover said pair of source and drain regions;

removing at least a part of the insulating film between said source and drain regions and at least one part of each of said other insulating films to expose the surface of the substrate and the surfaces of said source and drain regions, respectively;

forming thin insulating films of the same thickness to cover the exposed surfaces of said source and drain regions and the exposed surface of the substrate between said source and drain regions;

applying a mask layer of corrosion resisting material on the surfaces of the insulating films except at least a part of each of said thin insulating films covering said source and drain regions;

exposing the combination thus composed to an etchant to form openings extending to the surface of each of said source and drain regions;

removing said mask layer; and forming source and drain electrodes connected to said source and drain regions through said openings, respectively, and a gate electrode on said thin insulating film between said source and drain regions.

References Cited

UNITED STATES PATENTS

| | | | |
|---|---|---|---|
| 2,981,877 | 4/1961 | Noyce | 29—577 X |
| 3,025,589 | 3/1962 | Hoerni | 29—578 |
| 3,199,002 | 8/1965 | Martin | 29—577 X |
| 3,212,162 | 10/1965 | Moore | 29—578 |
| 3,270,256 | 8/1966 | Mills et al. | 29—577 |

PAUL M. COHEN, Examiner

U.S. Cl. X.R.

29—577, 578, 589; 148—187; 317—101, 235